United States Patent
Mita et al.

(10) Patent No.: US 7,619,299 B2
(45) Date of Patent: Nov. 17, 2009

(54) SEMICONDUCTOR DEVICE AND METHOD OF MANUFACTURING THE SAME

(75) Inventors: Keiji Mita, Gunma (JP); Kentaro Ooka, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 424 days.

(21) Appl. No.: 11/562,107

(22) Filed: Nov. 21, 2006

(65) Prior Publication Data

US 2007/0123006 A1    May 31, 2007

(30) Foreign Application Priority Data

Nov. 30, 2005    (JP)    ............................... 2005-345504

(51) Int. Cl.
*H01L 29/08*    (2006.01)
*H01L 29/732*    (2006.01)
*H01L 21/8222*    (2006.01)
*H01L 21/8228*    (2006.01)

(52) U.S. Cl. ................ 257/565; 257/555; 257/E27.057; 257/E29.034; 257/E29.183; 257/E21.375; 438/370

(58) Field of Classification Search .................. 257/565, 257/E29.034, E29.173, E29.183, E21.37, 257/E21.375, 555, E27.053, E27.055, E27.057; 438/309, 370, 372, 373, 375, 377
See application file for complete search history.

(56) References Cited

U.S. PATENT DOCUMENTS

| | | | | | |
|---|---|---|---|---|---|
| 3,638,081 | A | * | 1/1972 | Lloyd | 257/545 |
| 3,656,034 | A | * | 4/1972 | Rideout | 257/552 |
| 3,868,722 | A | * | 2/1975 | Le Can et al. | 257/552 |
| 3,912,555 | A | * | 10/1975 | Tsuyuki | 438/322 |
| 4,087,900 | A | * | 5/1978 | Yiannoulos | 438/324 |
| 4,373,252 | A | * | 2/1983 | Caldwell | 438/442 |
| 4,379,726 | A | * | 4/1983 | Kumamaru et al. | 438/340 |
| 4,458,158 | A | * | 7/1984 | Mayrand | 326/101 |
| 4,639,761 | A | * | 1/1987 | Singer et al. | 257/336 |
| 4,644,383 | A | * | 2/1987 | Akcasu | 257/517 |
| 4,678,994 | A | * | 7/1987 | Davies | 324/236 |
| 4,717,686 | A | * | 1/1988 | Jacobs et al. | 438/207 |
| 4,729,964 | A | * | 3/1988 | Natsuaki et al. | 438/220 |
| 4,780,425 | A | * | 10/1988 | Tabata | 438/357 |
| 4,780,430 | A | * | 10/1988 | Musumeci et al. | 438/340 |
| 4,855,244 | A | * | 8/1989 | Hutter et al. | 438/203 |
| 4,887,141 | A | * | 12/1989 | Bertotti et al. | 257/593 |
| 4,910,160 | A | * | 3/1990 | Jennings et al. | 438/17 |
| 4,939,099 | A | * | 7/1990 | Seacrist et al. | 438/189 |

(Continued)

FOREIGN PATENT DOCUMENTS

EP    0 500 233    *    8/1992

(Continued)

*Primary Examiner*—M. Wilczewski
(74) *Attorney, Agent, or Firm*—Fish & Richardson P.C.

(57) ABSTRACT

In a semiconductor device of the present invention, an N type epitaxial layer is formed on a P type single crystal silicon substrate. In the substrate and the epitaxial layer, an N type buried diffusion layer is formed on a P type buried diffusion layer. With this structure, an upward expansion of the P type buried diffusion layer is checked and a thickness of the epitaxial layer can be made small while maintaining the breakdown voltage characteristics of a power semiconductor element. Accordingly, a device size of a control semiconductor element can be reduced.

6 Claims, 10 Drawing Sheets

U.S. PATENT DOCUMENTS

| | | | | |
|---|---|---|---|---|
| 4,940,671 | A | * | 7/1990 | Small et al. ................ 438/322 |
| 5,065,214 | A | * | 11/1991 | Lapham et al. ............. 257/555 |
| 5,119,161 | A | * | 6/1992 | Zambrano et al. .......... 257/273 |
| 5,159,427 | A | * | 10/1992 | Ogura et al. ................ 257/500 |
| 5,246,871 | A | * | 9/1993 | Zambrano et al. .......... 438/189 |
| 5,262,345 | A | * | 11/1993 | Nasser et al. ............... 438/203 |
| 5,300,451 | A | * | 4/1994 | Zambrano ................... 438/234 |
| 5,317,182 | A | * | 5/1994 | Zambrano et al. .......... 257/378 |
| 5,326,710 | A | * | 7/1994 | Joyce et al. ................. 438/203 |
| 5,364,802 | A | * | 11/1994 | Kataoka et al. ............. 438/363 |
| 5,408,125 | A | * | 4/1995 | Erdeljac et al. ............. 257/607 |
| 5,416,039 | A | * | 5/1995 | Yilmaz et al. ............... 438/363 |
| 5,455,447 | A | * | 10/1995 | Hutter et al. ................ 257/545 |
| 5,581,115 | A | * | 12/1996 | Grubisich et al. ........... 257/592 |
| 5,614,755 | A | * | 3/1997 | Hutter et al. ................ 257/471 |
| 5,696,006 | A | * | 12/1997 | Hirai et al. .................. 438/203 |
| 5,798,560 | A | * | 8/1998 | Ohkawa et al. ............. 257/555 |
| 5,880,516 | A | * | 3/1999 | Yamazaki .................... 257/558 |
| 5,885,880 | A | * | 3/1999 | Gomi .......................... 438/322 |
| 6,146,957 | A | * | 11/2000 | Yamasaki ................... 438/326 |
| 6,846,710 | B2 | * | 1/2005 | Yi et al. ....................... 438/202 |
| 6,979,883 | B2 | * | 12/2005 | Spampinato ................ 257/570 |
| 7,192,826 | B2 | * | 3/2007 | Ejiri et al. ................... 438/238 |
| 2001/0034103 | A1 | * | 10/2001 | Gris et al. ................... 438/309 |
| 2002/0109151 | A1 | * | 8/2002 | Spampinato ................ 257/150 |
| 2003/0137029 | A1 | * | 7/2003 | Salling et al. ............... 257/565 |
| 2003/0146468 | A1 | * | 8/2003 | Gris et al. ................... 257/322 |
| 2004/0157387 | A1 | * | 8/2004 | Yi et al. ....................... 438/202 |
| 2004/0169257 | A1 | * | 9/2004 | Romas et al. ............... 257/565 |
| 2005/0006720 | A1 | * | 1/2005 | Ejiri et al. ................... 257/532 |
| 2005/0029624 | A1 | * | 2/2005 | Bottner et al. .............. 257/552 |
| 2005/0056907 | A1 | * | 3/2005 | Maeda ........................ 257/500 |
| 2005/0191818 | A1 | * | 9/2005 | Marty et al. ................ 438/348 |

FOREIGN PATENT DOCUMENTS

| | | | |
|---|---|---|---|
| JP | 55-62762 | * | 5/1980 |
| JP | 63-27061 | * | 2/1988 |
| JP | 2000-232111 | | 8/2000 |
| WO | WO 97/17726 | * | 5/1997 |

* cited by examiner

SEMICONDUCTOR DEVICE AND METHOD OF MANUFACTURING THE SAME

BACKGROUND OF THE INVENTION

Priority is claimed to Japanese Patent Application Number JP2005-345504 filed on Nov. 30, 2006, the disclosure of which is incorporated herein by reference in its entirety.

1. Field of the Invention

The present invention relates to a semiconductor device and a method of manufacturing the same, which reduce a collector resistance of a vertical PNP transistor used as a power semiconductor element.

2. Description of the Related Art

As an embodiment of a method of manufacturing a conventional semiconductor device, a method of manufacturing the following vertical PNP transistor has been known. A P type semiconductor substrate is prepared, and two N type epitaxial layers are formed on the substrate. An N type buried diffusion layer is formed so as to extend in the P type semiconductor substrate and a first epitaxial layer, and a P type buried diffusion layer is formed so as to extend in the first and second epitaxial layers. Then, a silicon nitride film is selectively formed over the P type buried diffusion layer in the surface of the second epitaxial layer. Thereafter, the P type buried diffusion layer is thermally diffused. By performing the thermal diffusion with the silicon nitride film formed, the upward expansion of the P type buried diffusion layer under the silicon nitride film is checked. Moreover, in a region over which a silicon nitride film is not formed, the P type buried diffusion layer expands upward and a concave portion is formed in the upper surface of the P type buried diffusion layer. On the other hand, in the surface of the second epitaxial layer, a LOCOS oxide film is formed in a region other than that where the silicon nitride film is formed. Subsequently, by removing the LOCOS oxide film, concave and convex portions are formed in the surface of the second epitaxial layer. Next, a collector region is formed by utilizing the concave portion of the second epitaxial layer and the upward expansion of the P type buried diffusion layer. Furthermore, a base region and an emitter region are formed by utilizing the convex portion of the second epitaxial layer and the concave portion of the P type buried diffusion layer. With the above-described method, breakdown voltage ($V_{CEO}$) between the emitter and the collector of the vertical PNP transistor is increased, and thus the vertical PNP transistor, which decreases saturation voltage (Vce), can be formed (This technology is described for instance in Japanese Patent Application Publication No. 2000-232111 (pp. 3-4, FIGS. 1 to 3), for example.)

As described above, in a conventional semiconductor device, for example, a power vertical PNP transistor and a control NPN transistor are monolithically formed. In the vertical PNP transistor, it is necessary to make an N type epitaxial layer thicker in order to improve breakdown voltage characteristics. On the other hand, in the control NPN transistor, there is the following problem. When the film thickness of the epitaxial layer is increased, an isolation region is extended in the lateral direction, and thus it is difficult to reduce a device size. That is, the monolithic formation of the power vertical PNP transistor and the control NPN transistor causes a problem in which the breakdown voltage characteristics of the power vertical PNP transistor and the reduction in the device size of the control NPN transistor are in a trade-off relationship.

Moreover, in a method of manufacturing a conventional semiconductor device, two epitaxial layers are formed on the P type semiconductor substrate. The P type buried diffusion layer to be used as the collector is formed so as to extend in the first and second epitaxial layers. The upward expansion of the P type buried diffusion layer is partially checked by the forming region of the silicon nitride film which is formed on the surface of the second epitaxial layers. However, even for the P type buried diffusion layer which is located under the silicon nitride film, a wraparound by oxygen, or the like, causes a problem that it is difficult to partially check the upward expansion. To be more precise, in a region where the upward expansion of the P type buried diffusion layer is to be checked, the upward expansion can be confined to only about 0.5 (μm) above the region. Accordingly, in order to satisfy desired breakdown voltage characteristics, it is necessary to form epitaxial layers of a two-layer structure, thus causing a problem that the manufacturing costs are increased.

In addition, in a method of manufacturing a conventional semiconductor device, the LOCOS oxide film is formed in the surface of the second epitaxial layer and then removed to form concave and convex portions on the surface of the epitaxial layer. Subsequently, the P type buried diffusion layer to be used as the collector region is formed from the surface of the epitaxial layer in which the concave portion is formed, and thus the P type diffusion layer is connected to the region of the P type buried diffusion layer, which expands upward. However, in some cases, the silicon nitride film is not formed in a desired region over the P type buried diffusion layer due to the displacement of a mask or the like which occurs when the silicon nitride film formed on the epitaxial layer is selectively removed. In such a case, a region where the P type diffusion layer overlaps the P type buried diffusion layer is reduced, and thus a collector resistance cannot be reduced. That is, the following problem is caused. Since element characteristics vary due to the displacement of a mask in each process, a highly accurate positioning is required. Accordingly, a manufacturing process is complicated.

Moreover, in a method of manufacturing a conventional semiconductor device, for the purpose of forming epitaxial layers on a semiconductor substrate, for example, a vapor phase epitaxial growth device employing a vertical reactor is used. When forming epitaxial layers, there is a problem that boron (B), which is a P type impurity diffused over the semiconductor substrate, tends to be easily auto-doped. In a case where an introduced amount of an impurity is increased in order to reduce a sheet resistance value of a buried diffusion layer, the amount of autodoping increases.

SUMMARY OF THE INVENTION

A semiconductor device of the present invention is made in consideration of the above described problems. The semiconductor device includes a semiconductor substrate of one conductivity type, an epitaxial layer of opposite conductivity type, a first buried diffusion layer of the one conductivity type, a first buried diffusion layer of the opposite conductivity type, a second buried diffusion layer of the opposite conductivity type, a diffusion layer of the opposite conductivity type, a first diffusion layer of the one conductivity type, and a second diffusion layer of the one conductivity type. The epitaxial layer of the opposite conductivity type is formed on the semiconductor substrate. The first buried diffusion layer of the one conductivity type is formed so as to extend in the semiconductor substrate and the epitaxial layer, and is used as the collector region. The first buried diffusion layer of the opposite conductivity type is formed so as to extend in the semiconductor substrate and the epitaxial layer, and isolates the semiconductor substrate from the first buried diffusion layer of the one conductivity type by junction isolation. The second buried diffusion layer of the opposite conductivity type has a forming area overlapping the first buried diffusion layer of the one conductivity type, and expands upward at least from an upper surface of the first buried diffusion layer of the one conductivity type. The diffusion layer of the opposite conductivity type is formed from a surface of the epitaxial layer, and is used as a base region. The first diffusion layer of the one conductivity type is formed from the surface of the epitaxial layer, and is used as the collector region. The second diffusion layer of the one conductivity type is formed in the diffusion layer of the opposite conductivity type, and is used as an emitter region. Accordingly, in the present invention, the upward expansion of the first buried diffusion layer of the one conductivity type used as the collector region is checked by the second buried diffusion layer of the opposite conductivity type.

In addition, the semiconductor device of the present invention includes the second buried diffusion layer of the opposite conductivity type is formed inside the first buried diffusion layer of the one conductivity type. Accordingly, in the present invention, in the first buried diffusion layer of the one conductivity type used as the collector region, a region in which an upward expansion occurs and a region in which an upward expansion is checked are selectively formed.

Additionally, the semiconductor device of the present invention includes the first buried diffusion layer of the one conductivity type expands upward in a way that the first buried diffusion layer of the one conductivity type surrounds the second buried diffusion layer of the opposite conductivity type. Accordingly, in the present invention, in the first buried diffusion layer of the one conductivity type used as the collector region, a region in which the upward expansion occurs is used as a connecting region for the collector region.

Moreover, the semiconductor device of the present invention includes, in a region to which the first buried diffusion layer of the one conductivity type has expanded upward, the second buried diffusion layer of the one conductivity type is formed in an overlapping manner. Accordingly, in the present invention, the first diffusion layer of the one conductivity type is connected to a region in which the first and second buried diffusion layers overlap each other, so that a collector resistance can be reduced.

Furthermore, the semiconductor device of the present invention includes the first diffusion layer of the one conductivity type is connected to the first buried diffusion layer of the one conductivity type, and in the connecting region, the second buried diffusion layer of the one conductivity type is formed. Accordingly, in the present invention, a region to which the first buried diffusion layer of the one conductivity type expands upward is used as a connecting region for the collector region. The first buried diffusion layer of the one conductivity type can be confined, and the width of lateral diffusion thereof can also be reduced.

Still furthermore, the semiconductor device of the present invention includes an impurity forming the first buried diffusion layer of the one conductivity type is boron, and an impurity forming the second buried diffusion layer of the opposite conductivity type is phosphorus. Accordingly, in the present invention, the upward expansion of the first buried diffusion layer of the one conductivity type is checked by the second buried diffusion layer of the opposite conductivity type.

The method of manufacturing the semiconductor device of the present invention includes the method includes the steps of preparing a semiconductor substrate of one conductivity type, forming a first buried diffusion layer of opposite conductivity type in the semiconductor substrate, and thereafter, forming the first buried diffusion layer of the one conductivity type in the semiconductor substrate so that the first buried diffusion layer of the one conductivity type is isolated from the semiconductor substrate by junction isolation by the first buried diffusion layer of the opposite conductivity type, implanting ions of an impurity of the opposite conductivity type into a region in which the first buried diffusion layer of the one conductivity type to form a second buried diffusion layer of the opposite conductivity type, and forming an epitaxial layer of the opposite conductivity type on the semiconductor substrate, and in a surface of the epitaxial layer, forming a first diffusion layer of the one conductivity type to be used as a collector region, a diffusion layer of the opposite conductivity type to be used as a base region, and a second diffusion layer of the one conductivity type to be used as an emitter region. Accordingly, in the present invention, after forming the second buried diffusion layer of the opposite conductivity type in a region in which the first buried diffusion layer of the one conductivity type, the epitaxial layer is formed on the semiconductor substrate. With this method, in a region in which the second buried diffusion layer of the opposite conductivity type is formed, the upward expansion of the first buried diffusion layer of the one conductivity type can be checked.

Moreover, the method of the present invention includes, before implanting the ions of the impurity to form the second buried diffusion layer of the opposite conductivity type, the step of thermal oxidization is performed on the semiconductor substrate. Accordingly, in the present invention, with an impurity concentration in the surface of the first buried diffusion layer of the one conductivity type and in the vicinity of the surface, ions of an impurity of the opposite conductivity type are implanted. With this method, the upward expansion of the first buried diffusion layer of the one conductivity type can be checked. Additionally, when forming the epitaxial layer, the autodoping of an impurity of one conductivity type can be confined.

Furthermore, the method of the present invention includes, between the step of thermal oxidation and the step of implanting the ions of the impurity to form the second buried diffusion layer of the opposite conductivity type, the step of thermal processing in a non-oxidizing atmosphere is not performed. Accordingly, in the present invention, by implanting the ions of the impurity of the opposite conductivity type into a region in which the concentration of the impurity of the one conductivity type has become low, the second buried diffusion layer of the opposite conductivity type can be effectively formed.

DETAILED DESCRIPTION OF THE PREFERRED EMBODIMENTS

Figure 1:
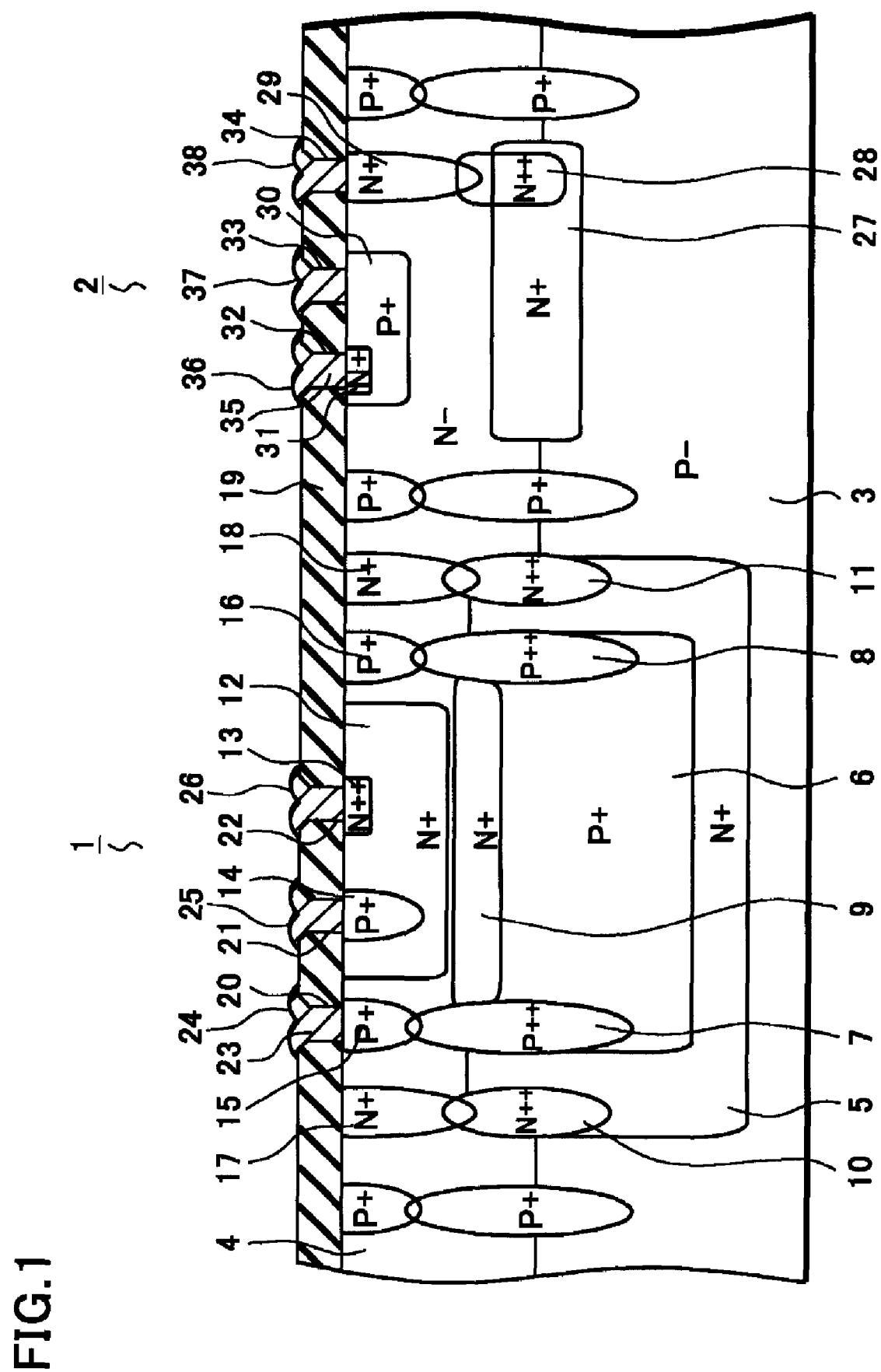
FIG. 1 is a sectional view for describing a semiconductor device of an embodiment of the present invention.
Figure 2A:
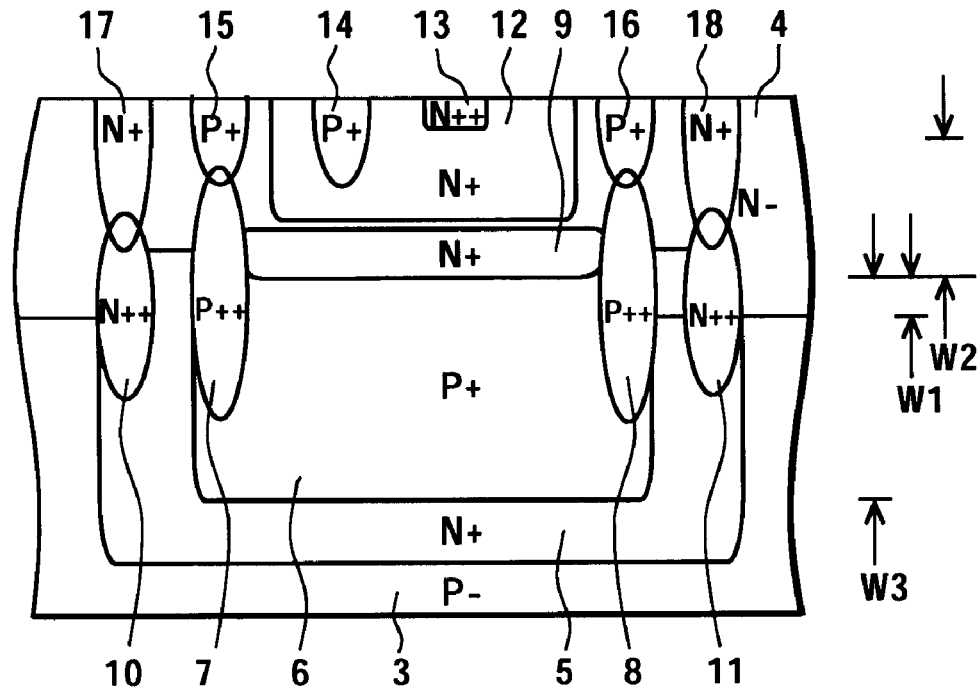
FIGS. 2A and 2B are sectional views for describing the semiconductor device of the embodiment of the present invention.
Figure 2B:
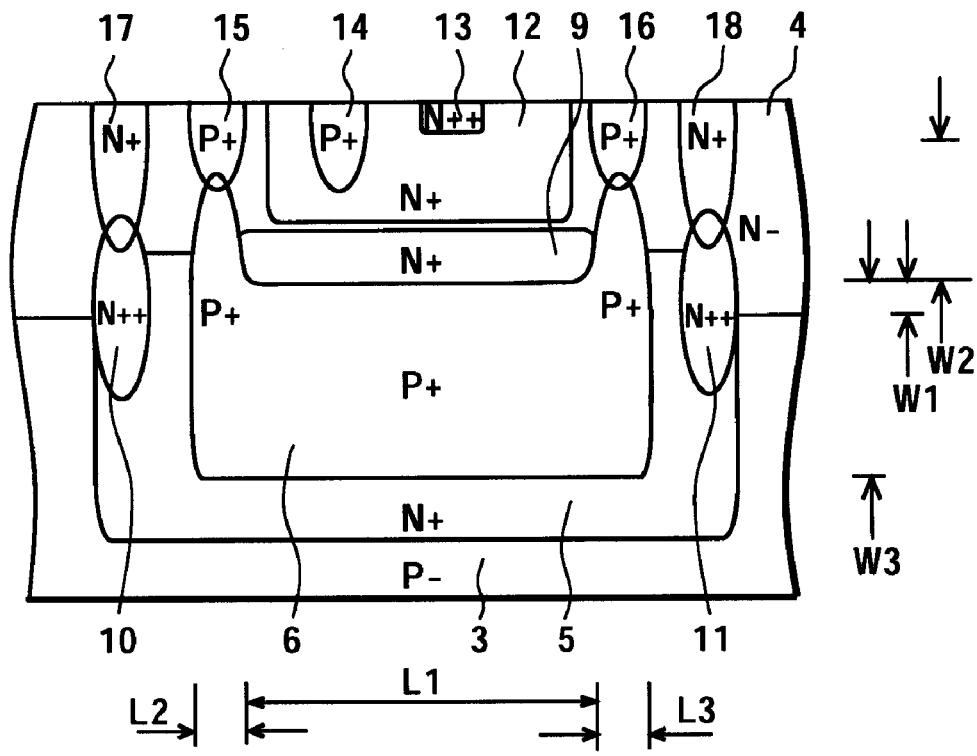
Figure 3A:
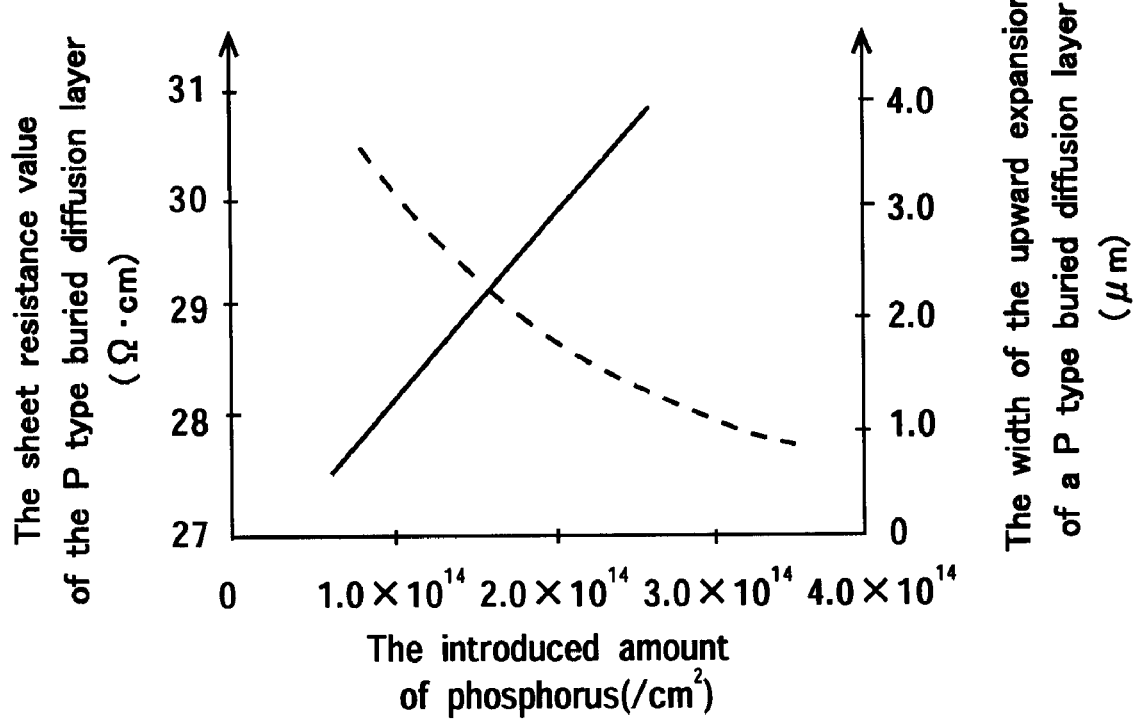
FIG. 3A is a view for describing a sheet resistance value and the width of the upward expansion of a buried diffusion layer of the semiconductor device of the embodiment of the present invention.
Figure 3B:
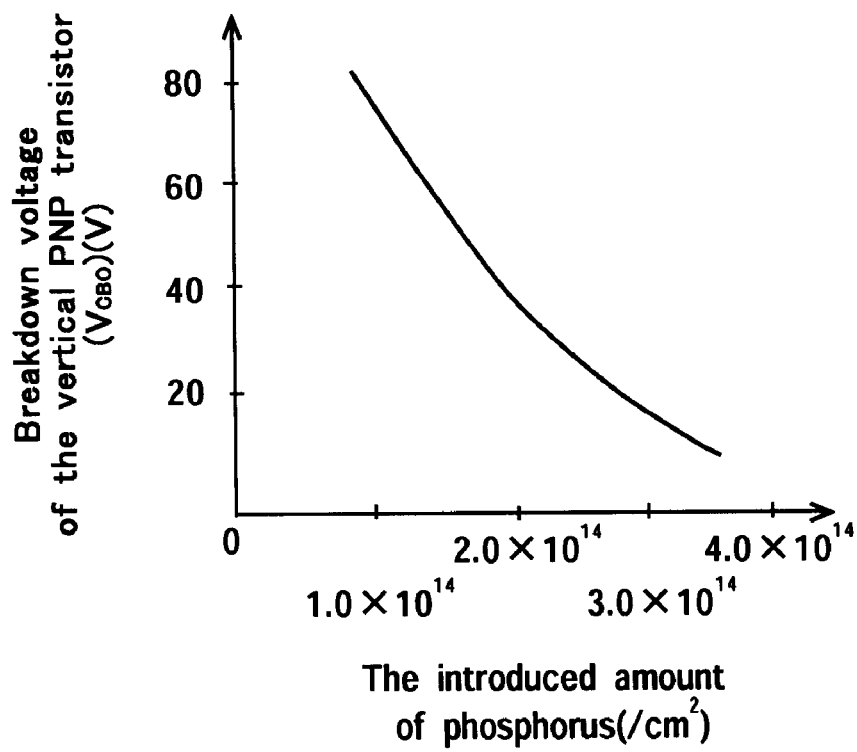
FIG. 3B is a view for describing breakdown voltage characteristics of the semiconductor device of the embodiment of the present invention.

An embodiment of a semiconductor device of the present invention is described below in detail with reference to FIGS. 1 to 3. FIG. 1 is a sectional view for describing a semiconductor device of the present embodiment. FIG. 2A is a sectional view for describing a vertical PNP transistor of the present embodiment. FIG. 2B is a sectional view for describing a vertical PNP transistor of the present embodiment. FIG. 3A is a graph for describing the sheet resistance value and the width of the upward expansion of a buried diffusion layer of the semiconductor device of the present embodiment. FIG. 3B is a graph for describing the breakdown voltage characteristics of the semiconductor device of the present embodiment.

As shown in FIG. 1, a vertical PNP transistor 1 and a vertical NPN transistor 2 are monolithically formed on a P type single crystal silicon substrate 3. For example, the vertical PNP transistor 1 is used as a power semiconductor element, and the vertical NPN transistor 2 is used as a control semiconductor element. Incidentally, in regions where other elements are to be formed, an NPN power transistor having a large area, or the like, is formed as a power semiconductor element, and an NPN transistor having a small area, or the like, is formed as a control semiconductor element. The vertical PNP transistor 1 mainly includes the P type single crystal silicon substrate 3, an N type epitaxial layer 4, an N type buried diffusion layer 5, P type buried diffusion layers 6, 7 and 8, which are used as a collector region, N type buried diffusion layers 9, 10 and 11, N type diffusion layers 12 and 13, which are used as base regions, P type diffusion layers 15 and 16, which are used as the collector region, and N type diffusion layers 17, 18.

The N type epitaxial layer 4 is formed on the P type single crystal silicon substrate 3.

The N type buried diffusion layer 5 is formed so as to extend in the substrate 3 and the epitaxial layer 4. The N type buried diffusion layer 5 is formed up to a deeper position in the substrate 3 than the P type buried diffusion layer 6. The N type buried diffusion layer 5 forms PN junction regions respectively with the substrate 3 and the P type buried diffusion layer 6, and thereby the substrate 3 and the P type buried diffusion layer 6 are electrically isolated from each other by the PN junction isolation.

Each of the P type buried diffusion layers 6, 7 and 8 is formed so as to extend in the substrate 3 and the epitaxial layer 4. The P type buried diffusion layers 7 and 8 are arranged respectively in the vicinities of the corresponding ends of the P type buried diffusion layer 6, and each of the P type buried diffusion layers 7 and 8 is connected to the P type buried diffusion layer 6. The P type buried diffusion layers 7 and 8 may be formed in an annular shape in the vicinities of the ends of the P type buried diffusion layer 6, or may be formed only in regions to be drawn as the collector region.

The N type buried diffusion layer 9 expands upward at least from an upper surface of the P type buried diffusion layer 6 towards the surface side of the epitaxial layer 4. On the other hand, each of the N type buried diffusion layers 10 and 11 is formed so as to extend in the substrate 3 and the epitaxial layer 4. The N type buried diffusion layers 10 and 11 are arranged in a way that the N type buried diffusion layers 10 and 11 surround the P type buried diffusion layers 6, 7 and 8.

The N type diffusion layer 12 is formed in the epitaxial layer 4. In the N type diffusion layer 12, the N type diffusion layer 13 is formed. The N type diffusion layer 13 is used as a base drawing region.

The P type diffusion layer 14 is formed in the N type diffusion layer 12.

The P type diffusion layers 15 and 16 are formed in the epitaxial layer 4. The P type diffusion layers 15 and 16 are arranged in a way that the P type diffusion layers 15 and 16 surround the N type diffusion layer 12. The P type diffusion layer 15 and the P type buried diffusion layers 7 and 6 are connected, and the P type diffusion layer 16 and the P type buried diffusion layers 8 and 6 are connected. The P type diffusion layers 15 and 16 may be formed in an annular shape in a way that the P type diffusion layers 15 and 16 surround the N type diffusion layer 12, or may be formed only in regions to be drawn as the collector region.

The N type diffusion layers 17 and 18 are formed in the epitaxial layer 4. The N type diffusion layers 17 and 18 are formed in an annular shape in a way that the N type diffusion layers 17 and 18 surround the P type diffusion layers 15 and 16. The N type diffusion layer 17 and the N type buried diffusion layers 10 and 5 are connected, and the N type diffusion layer 18 and the N type buried diffusion layers 11 and 5 are connected. That is, the N type diffusion layers 17 and 18 are arranged in a way that they surround the outer circumferences of the P type diffusion layers 15 and 16 which are the collector region. Accordingly, a surface of the epitaxial layer 4 is inversed, and thus collector current is prevented from flowing to the substrate 3 through an isolation region.

An insulating layer 19 is formed on the upper surface of the epitaxial layer 4. The insulating layer 19 is formed of a phospho silicate glass (hereinafter, abbreviated as PSG) film or the like. By using a known photolithographic technique, contact holes 20, 21 and 22 are formed in the insulating layer 19 by dry etching using gas containing $CHF_3 + O_2$, for example.

In the contact holes 20, 21 and 22, an aluminum alloy, for example, an Al—Si film 23 is selectively formed, thus forming a collector electrode 24, an emitter electrode 25 and a base electrode 26, respectively.

The vertical NPN transistor 2 mainly includes the P type single crystal silicon substrate 3, the N type epitaxial layer 4, N type buried diffusion layers 27 and 28, which are used as the collector region, an N type diffusion layer 29, which is used as the collector region, a P type diffusion layer 30, which is used as a base region, and an N type diffusion layer 31, which is used as an emitter region.

The N type epitaxial layer 4 is formed on the P type single crystal silicon substrate 3.

The N type buried diffusion layer 27 is formed so as to extend in the substrate 3 and the epitaxial layer 4.

The N type buried diffusion layer 28 is formed in a way that a forming region thereof overlaps the N type buried diffusion layer 27. In addition, the N type buried diffusion layer 28 expands upward from the N type buried diffusion layer 27 towards the surface side of the epitaxial layer 4. By forming the N type buried diffusion layer 28, the resistance of the collector region can be reduced.

The N type diffusion layer 29 is formed in the N type epitaxial layer 4. The N type diffusion layer 29 is connected to the N type buried diffusion layer 28 to be used as the collector region. By connecting the N type diffusion layer 29 to the N type buried diffusion layer 28, the extension of the N type diffusion layer 29 in the lateral direction can be confined, and thus the device size of the vertical NPN transistor 2 can be reduced.

The P type diffusion layer 30 is formed in the epitaxial layer 4.

The N type diffusion layer 31 is formed in the P type diffusion layer 30.

The insulating layer 19 is formed on the upper surface of the epitaxial layer 4. By using a known photolithographic technique, contact holes 32, 33 and 34 are formed in the insulating layer 19 by dry etching using gas containing $CHF_3+O_2$, for example.

In the contact holes 32, 33 and 34, an aluminum alloy, for example, an Al—Si film 35 is selectively formed, thus forming an emitter electrode 36, a base electrode 37 and a collector electrode 38, respectively.

As shown in FIG. 2A, the P type buried diffusion layers 6, 7 and 8 and the P type diffusion layers 15 and 16 are the collector region of the vertical PNP transistor 1. The N type buried diffusion layer 9, the N type epitaxial layer 4 and the N type diffusion layers 12 and 13 are the base region of the vertical PNP transistor 1. The P type diffusion layer 14 is the emitter region of the vertical PNP transistor 1. On the P type buried diffusion layer 6 formed of a P type impurity, for example, boron (B), the N type buried diffusion layer 9 formed of an N type impurity, for example, phosphorus (P) is formed, and thus the upward expansion of the P type buried diffusion layer 6 to the epitaxial layer 4 is checked. To be more precise, the width W1 of the upward expansion of the P type buried diffusion layer 6 from the surface of the substrate 3 is on the order of 2.0 to 4.0 (μm). In the case of not forming the N type buried diffusion layer 9, the P type buried diffusion layer 6 expands upward from the surface of the substrate 3 on the order of 5.5 (μm), in general. That is, by forming the N type buried diffusion layer 9 on the P type buried diffusion layer 6, the width of the upward expansion of the P type buried diffusion layer 6 is checked on the order of 1.5 to 3.5 (μm).

With this structure, in the vertical PNP transistor 1, even in the case of securing a desired width W2 of the base region, the film thickness of the epitaxial layer 4 can be made small. For example, a film thickness of the epitaxial layer 4 is made on the order of 6.5 to 7.5 (μm). As a result, in the vertical PNP transistor 1 as the power semiconductor element, although the film thickness of the epitaxial layer 4 is small, the breakdown voltage characteristics thereof can be prevented from deteriorating. On the other hand, in the vertical NPN transistor 2 as the control semiconductor element, the small film thickness of the epitaxial layer 4 reduces lateral diffusion of the isolation region, thus reducing the device size. That is, the width W1 of the upward expansion of the P type buried diffusion layer 6 is checked and the epitaxial layer 4 is formed with small film thickness. Accordingly, the power semiconductor element having desired breakdown voltage characteristics and a control semiconductor element, which device size is small, are monolithically formed.

Furthermore, as shown in FIG. 2A, the collector region formed of the P type buried diffusion layer 6 has a width W3 in the depth direction of the substrate 3. That is, although the width W1 of the upward expansion of the epitaxial layer 4 is checked, the width W3 of the P type buried diffusion layer 6 can be secured by use of the substrate 3, and thereby a collector resistance is reduced. Incidentally, as described above, the N type buried diffusion layer 5 is formed deeper in the substrate 3 than the P type buried diffusion layer 6.

Here, as shown in FIG. 2B, in a region L1 where the N type buried diffusion layer 9 is formed on an upper surface of the P type buried diffusion layer 6, the upward expansion of the P type buried diffusion layer 6 is checked. On the other hand, the N type buried diffusion layer 9 is formed inside the P type buried diffusion layer 6. For this reason, in regions L2 and L3 where the N type buried diffusion layer 9 is not formed, the P type buried diffusion layer 6 expands upward to the surface side of the epitaxial layer 4. In the regions L2 and L3, the P type buried diffusion layer 6 is formed in a way that the P type buried diffusion layer 6 surrounds the N type buried diffusion layer 9. The P type diffusion layers 15 and 16, which are used as the collector region, are connected to the P type buried diffusion layer 6 respectively in the regions L2 and L3. The connections of the P type diffusion layers 15 and 16 to the region in which the P type buried diffusion layer 6 has expanded upward can reduce the collector resistance.

As shown in FIG. 2A, in the regions L2 and L3 where the N type buried diffusion layer 9 is not formed, the P type buried diffusion layers 7 and 8 are formed with overlapping the P type buried diffusion layer 6. As described above, the P type diffusion layer 15 is connected to the P type buried diffusion layers 7 and 6 in this order and the P type diffusion layer 16 is connected to the P type buried diffusion layers 8 and 6 in this order, thus forming the collector region. With this structure, the collector resistance of the vertical PNP transistor 1 can be further reduced.

As shown in FIG. 3A, the introduced amount of impurity of the N type buried diffusion layer 9 is shown on the horizontal axis. On a vertical axis (on the left side of the sheet), the sheet resistance value of the P type buried diffusion layer 6 is shown. On the other vertical axis (on the right side of the sheet), the width W1 of the upward expansion of the P type buried diffusion layer 6 (refer to FIGS. 2A and 2B) is shown. The solid line shows the relationship between the introduced amount of impurity of the N type buried diffusion layer 9 and the sheet resistance value of the P type buried diffusion layer 6. The dashed line shows the relationship between the introduced amount of impurity of the N type buried diffusion layer 9 and the width W1 of the upward expansion of the P type buried diffusion layer 6.

As shown by the solid line, the sheet resistance value of the P type buried diffusion layer 6 increases as the introduced amount of impurity of the N type buried diffusion layer 9 increases. On the other hand, as shown by the dashed line, the width W1 of the upward expansion of the P type buried diffusion layer 6 decreases as the introduced amount of impurity of the N type buried diffusion layer 9 increases. While the width W1 of the upward expansion of the P type buried diffusion layer 6 decreases as the introduced amount of impurity of the N type buried diffusion layer 9 increases, the sheet resistance value of the P type buried diffusion layer 6 increases. On the other hand, while the sheet resistance value of the P type buried diffusion layer 6 decreases as the introduced amount of impurity of the N type buried diffusion layer 9 decreases, the width W1 of the upward expansion of the P type buried diffusion layer 6 increases. That is, the sheet resistance value and the width W1 of the upward expansion of the P type buried diffusion layer 6 are in a trade-off relationship with respect to the introduced amount of impurity of the N type buried diffusion layer 9. Accordingly, the introduced amount of impurity of the N type buried diffusion layer 9 can be set at a desired one, depending on the relationship between the sheet resistance value and the width W1 of the upward expansion of the P type buried diffusion layer 6.

As shown in FIG. 3B, the introduced amount of impurity of the N type buried diffusion layer 9 is shown on the horizontal axis. On the vertical axis, breakdown voltage ($V_{CBO}$) of the vertical PNP transistor 1 is shown. As shown by the solid line, the breakdown voltage ($V_{CBO}$) decreases as the introduced amount of impurity of the N type buried diffusion layer 9 increases. This is because the breakdown voltage ($V_{CBO}$) of the vertical PNP transistor 1 is determined depending on the PN junction region formed by the P type buried diffusion layer 6 with high-impurity concentration and the N type buried diffusion layer 9 with high-impurity concentration. As shown in FIG. 3A, while the width W1 of the upward expansion of the P type buried diffusion layer 6 decreases as the introduced amount of impurity of the N type buried diffusion layer 9 increases, the breakdown voltage ($V_{CBO}$) of the vertical PNP transistor 1 decreases. That is, the introduced amount of impurity of the N type buried diffusion layer 9 is determined depending on the relationship among the breakdown voltage ($V_{CBO}$) of the vertical PNP transistor 1, the sheet resistance value of the P type buried diffusion layer 6 and the width W1 of the upward expansion thereof.

Incidentally, as shown in FIG. 2A and FIG. 2B, it is not necessary to have a structure in which the N type diffusion layer 12 and the N type buried diffusion layer 9 are not connected to each other. For example, a structure is applicable, in which the N type diffusion layer 12 and the N type buried diffusion layer 9 are connected to each other. In this case, the impurity concentration of the N type buried diffusion layer 9 becomes higher, and as described above, breakdown voltage characteristics of the PN junction area between the P type buried diffusion layer 6 and the N type buried diffusion layer 9 are considered, whereby the impurity concentrations of the N type diffusion layer 12 and the N type buried diffusion layer 9 are set.

Next, a method of manufacturing a semiconductor device of an embodiment of the present invention is described in detail with reference to FIGS. 4 to 10. FIGS. 4 to 10 are sectional views for describing the method of manufacturing the semiconductor device of the present embodiment.

Figure 4:
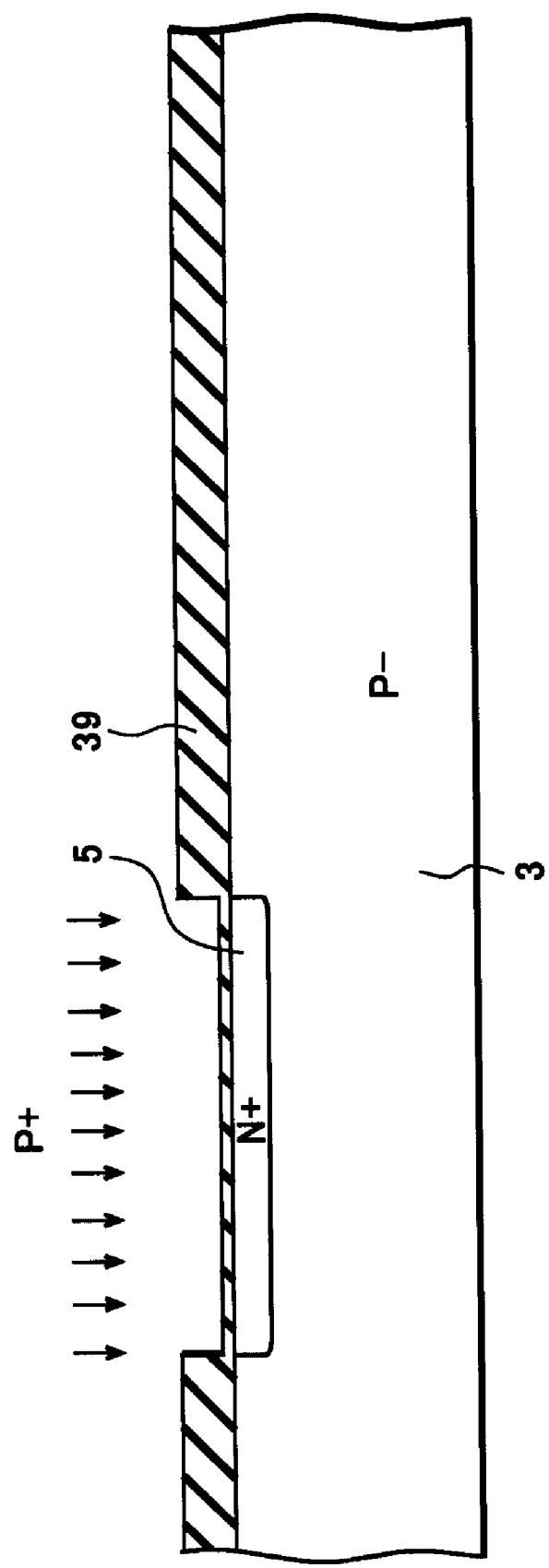
FIG. 4 is a first sectional view for describing a method of manufacturing the semiconductor device of the embodiment of the present invention.

First, as shown in FIG. 4, a P type single crystal silicon substrate 3 is prepared. A silicon oxide film 39 is formed on the substrate 3. On the silicon oxide film 39, a region is formed, in which an N type buried diffusion layer 5 is selectively formed thinly. By using the silicon oxide film 39 as a mask, ions of an N type impurity, for example, phosphorus (P), are implanted from the surface of the substrate 3 at an accelerating voltage of 90 to 110 (keV) with an introduced amount of $1.0 \times 10^{13}$ to $1.0 \times 10^{15}$ (/cm$^2$). Subsequently, after the phosphorus (P) is thermally diffused and the N type buried diffusion layer 5 is thus formed, the silicon oxide film 39 is removed.

Figure 5:
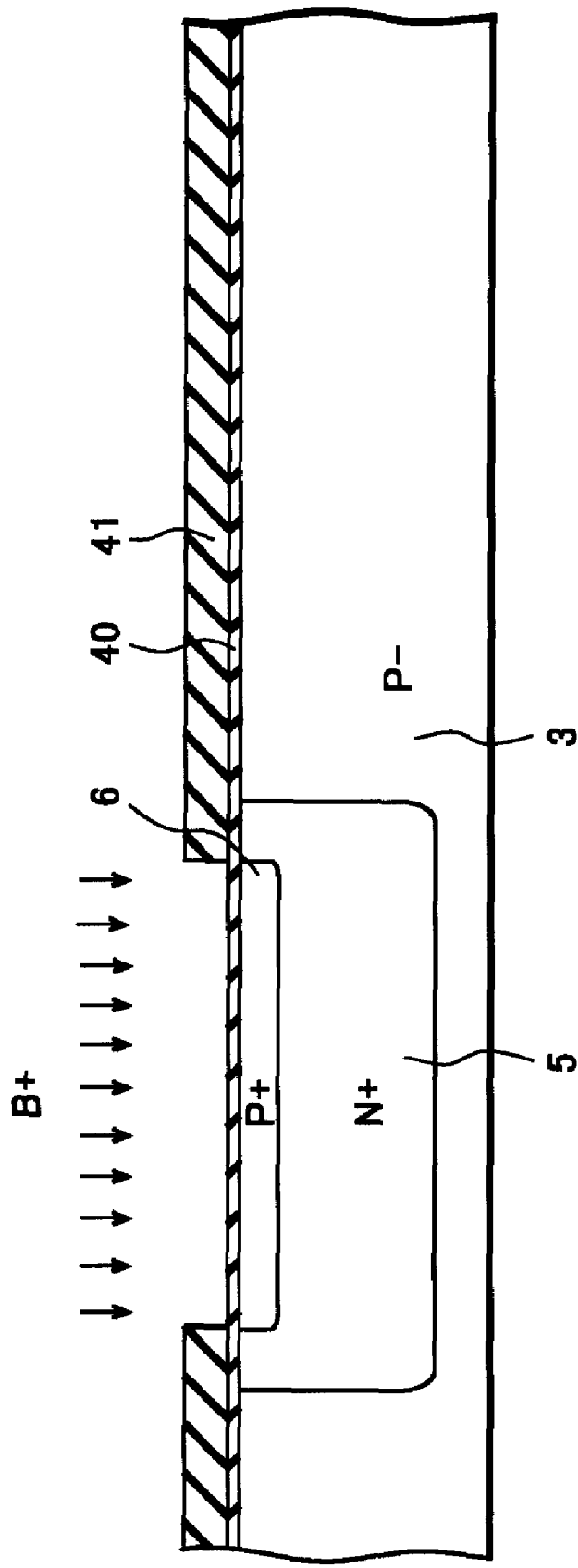
FIG. 5 is a second sectional view for describing the method of manufacturing the semiconductor device of the embodiment of the present invention.

Next, as shown in FIG. 5, a silicon oxide film 40 with, for example, approximately 450 (Å) is deposited on the substrate 3. Then, on the silicon oxide film 40, a photoresist 41 is formed. By using a known photolithographic technique, an opening is formed in the photoresist 41, above a region where a P type buried diffusion layer 6 is to be formed. Thereafter, ions of a P type impurity, for example, boron (B) are implanted from a surface of the substrate 3 at an accelerating voltage of 90 to 110 (keV) with an introduced amount of $1.0 \times 10^{14}$ to $1.0 \times 10^{16}$ (/cm$^2$). The photoresist 41 is then removed and the boron (B) is thermally diffused to form the P type buried diffusion layer 6. At this time, the surface of the substrate 3 is thermally oxidized to form a silicon oxide film 42 (refer to FIG. 6) on the surface of the substrate 3.

Figure 6:
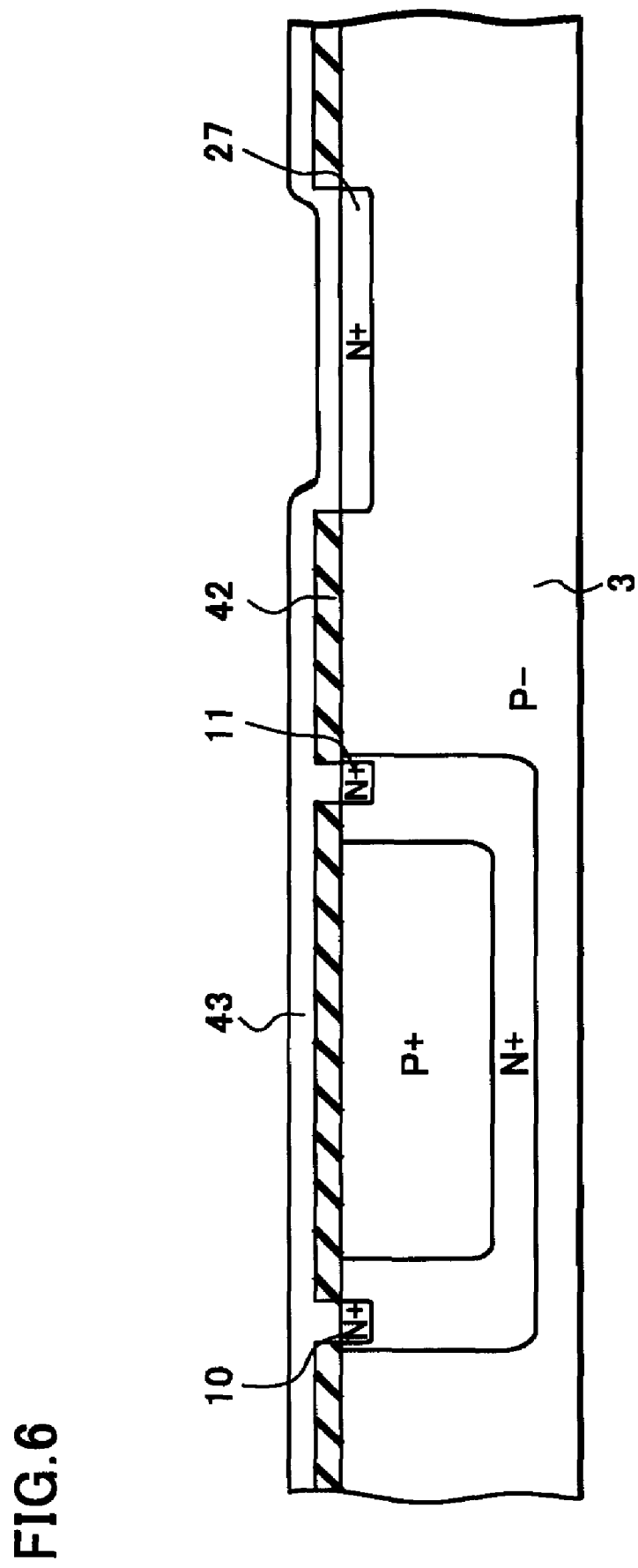
FIG. 6 is a third sectional view for describing the method of manufacturing the semiconductor device of the embodiment of the present invention.

Next, as shown in FIG. 6, the silicon oxide film 42 is selectively removed so that openings are formed on regions where N type buried diffusion layers 10, 11 and 27 are to be formed. By using the silicon oxide film 42 as a mask, liquid sauce 43 containing an N type impurity, for example, antimony (Sb) is applied on the surface of the substrate 3 by a spin-coating method. Thereafter, the antimony (Sb) is thermally diffused to form the N type buried diffusion layers 10, 11 and 27.

Here, with the silicon oxide film 42 deposited on the substrate 3, a thermal oxidation process is performed on the substrate 3 by leaving the substrate 3 in an oxidizing atmosphere at 1200 to 1250 (° C.) for about one hour. By this thermal oxidation process, the boron (B) in the surface of the P type buried diffusion layer 6 and the vicinity of the surface (for example, a region up to a position on the order of 3.5 (μm) from the surface of an epitaxial layer 4) is diffused to the silicon oxide film 42. Consequently, while the concentration of the boron (B) in the surface of the P type buried diffusion layer 6 and the vicinity of the surface is different depending on the depth, the concentration decreases to about half of that prior to the thermal oxidation process. Thereafter, the silicon oxide film 42 is removed.

It should be noted that, in this thermal oxidation process, the substrate 3 is left in an oxidizing atmosphere at a temperature grater than 1000 (° C.) at least, so that boron (B) in a deeper region of the substrate 3 can be prevented from diffusing to the surface of the substrate 3. Moreover, the substrate 3 may be left in an oxidizing atmosphere until the thermal oxidation process is completed. By this thermal oxidation process, the silicon oxide film 42 grows from a thickness of about 6000 to 7000 (Å) to a thickness of about 10000 (Å).

Figure 7:
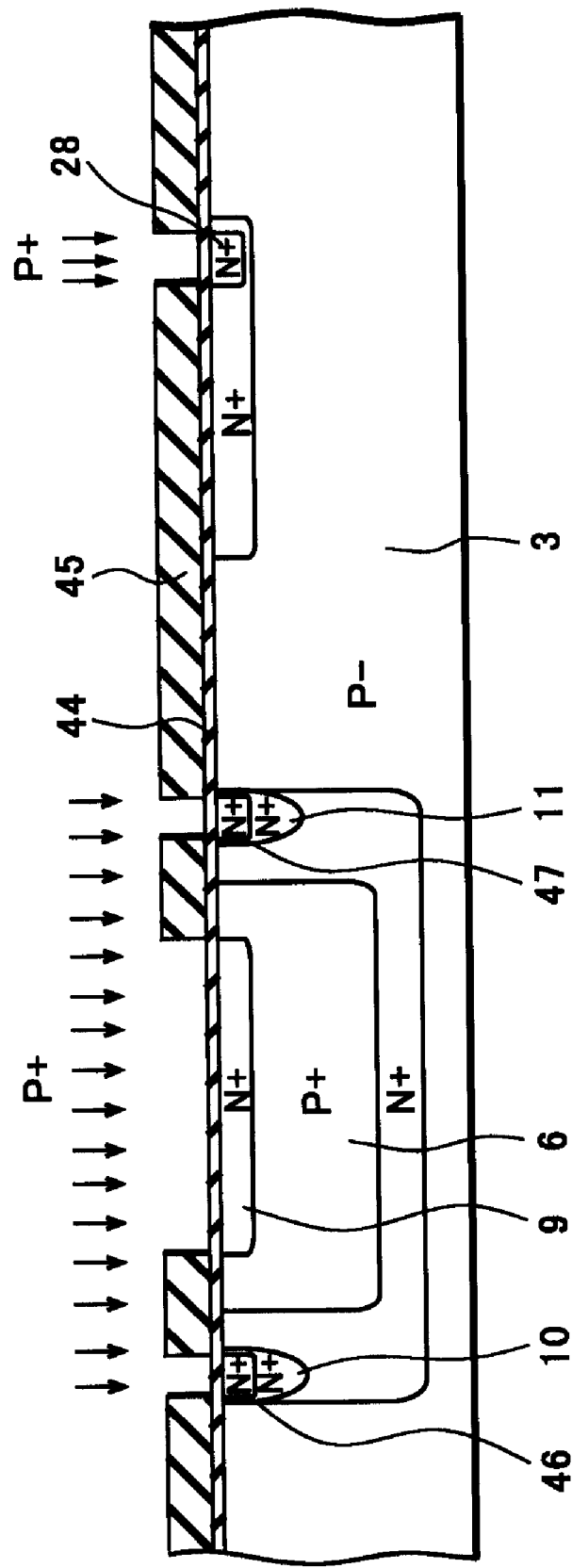
FIG. 7 is a fourth sectional view for describing the method of manufacturing the semiconductor device of the embodiment of the present invention.

Next, as shown in FIG. 7, a silicon oxide film 44 is deposited on the substrate 3, for example, about 100 to 450 (Å). Subsequently, a photoresist 45 is formed on the silicon oxide film 44. By using a known photolithographic technique, openings are formed in the photoresist 45 above regions where N type buried diffusion layers 9, 28, 46 and 47 are to be formed, respectively. Thereafter, ions of an N type impurity, for example, phosphorus (P) are implanted from the surface of the substrate 3 at an accelerating voltage of 30 to 110 (keV) with an introduced amount of $1.0 \times 10^{13}$ to $1.5 \times 10^{15}$ (/cm$^2$) to form the N type buried diffusion layers 9, 28, 46 and 47. The photoresist 45 is, thereafter, removed.

At this time, as described above using FIG. 6, since the concentration of the boron (B) in the surface of the P type buried diffusion layer 6 and the vicinity of the surface has decreased, the amount of phosphorus (P) which cancels with boron (B) decreases. Accordingly, the amount of phosphorus (P) to be introduced can be reduced. Furthermore, also in the thermal oxidation process for forming the silicon oxide film 44 on the substrate 3, the boron (B) in the surface of the P type buried diffusion layer 6 and the vicinity of the surface is diffused to the silicon oxide film 44.

Moreover, when openings are formed in the photoresist 45, the same alignment mark as that used in forming the P type buried diffusion layer 6 is used. With this method, since the N type buried diffusion layer 9 can be formed at a high accuracy of position with respect to the P type buried diffusion layer 6, the upward expansion in a desired region of the P type buried diffusion layer 6 can be prevented.

Figure 8:
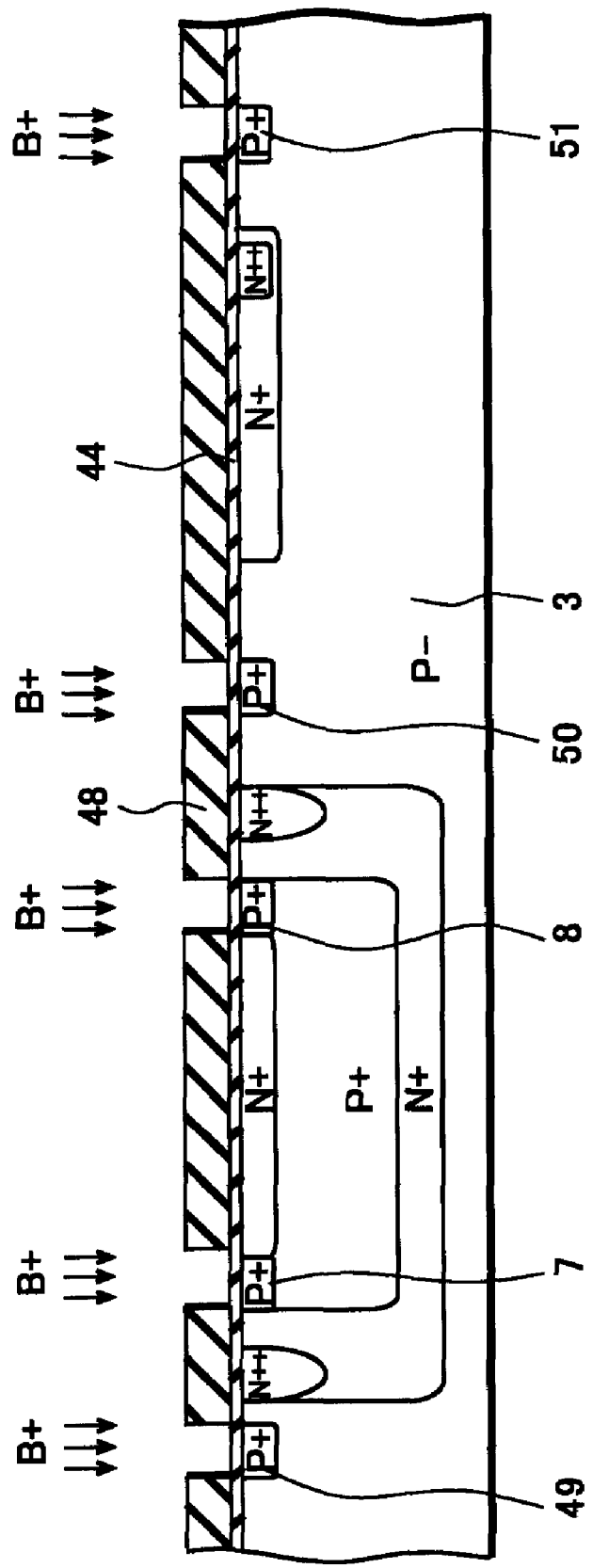
FIG. 8 is a fifth sectional view for describing the method of manufacturing the semiconductor device of the embodiment of the present invention.

Incidentally, in FIG. 8 and the following figures, the N type buried diffusion layer 46 is integrally shown with the N type buried diffusion layer 10, and the N type buried diffusion layer 47 is integrally shown with the N type buried diffusion layer 11.

Next, as shown in FIG. 8, a photoresist 48 is formed above the silicon oxide film 44. By using a known photolithographic technique, openings are formed in the photoresist 48 above regions where P type buried diffusion layers 7, 8, 49 and 50 are formed, respectively. Thereafter, ions of a P type impurity, for example, boron (B) are implanted from the surface of the substrate 3 at an accelerating voltage of 90 to 180 (keV) with an introduced amount of $0.5 \times 10^{14}$ to $1.0 \times 10^{16}$ (/cm$^2$). The photoresist 48 is then removed.

Figure 9:
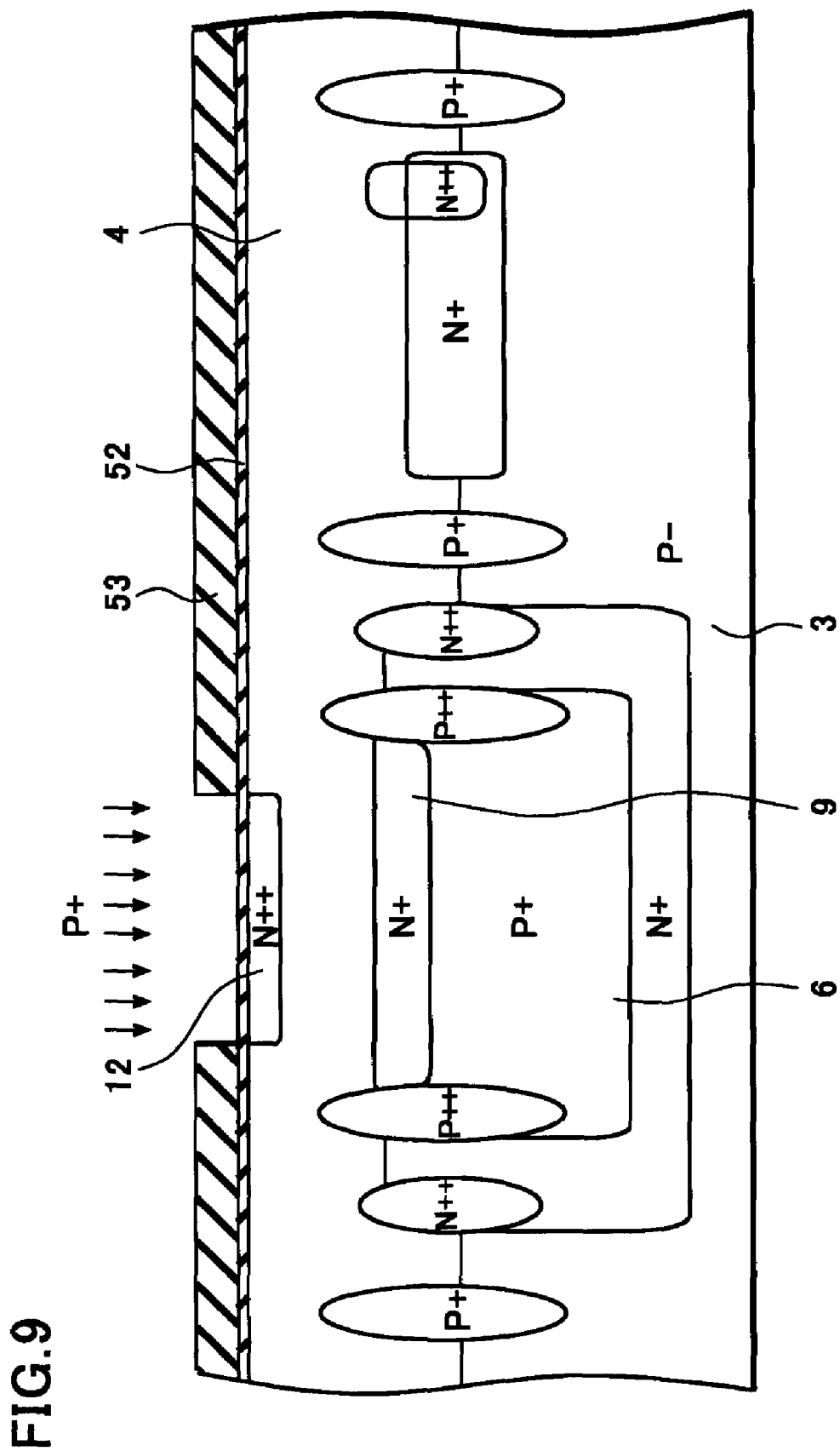
FIG. 9 is a sixth sectional view for describing the method of manufacturing the semiconductor device of the embodiment of the present invention.

As shown in FIG. 9, the substrate 3 is placed on a susceptor of a vapor phase epitaxial growth device to form the epitaxial layer 4 on the substrate 3. The vapor phase epitaxial growth device includes a gas supply system, a reactor, an exhaust system, and a control system. In the present embodiment, by using a vertical reactor, uniformity in the film thickness of the epitaxial layer can be improved. On the other hand, as described above using FIGS. 6 and 7, the concentration of the boron (B) in the surface of the P type buried diffusion layer 6 and the vicinity of the surface has decreased by the thermal oxidation process. The N type buried diffusion layer 9 is formed with overlapping the P type buried diffusion layer 6. Accordingly, when forming the epitaxial layer 4 on the substrate 3, autodoping of boron (B) can be confined.

Subsequently, on the epitaxial layer 4, a silicon oxide film 52 is deposited, for example, about 450 (Å). A photoresist 53 is, then, formed on the silicon oxide film 52. By using a known photolithographic technique, an opening is formed in the photoresist 53 above a region where an N type diffusion layer 12 is formed. By using the photoresist 53 as a mask, ions of an N type impurity, for example, phosphorus (P) are implanted from the surface of the epitaxial layer 4 at an accelerating voltage of 90 to 110 (keV) with an introduced amount in the range of $1.0 \times 10^{13}$ to $1.0 \times 10^{15}$ (/cm$^2$). Thereafter, the photoresist 53 is removed and the phosphorus (P) is thermally diffused to form the N type diffusion layer 12 together with a thermally-oxidized film.

Figure 10:
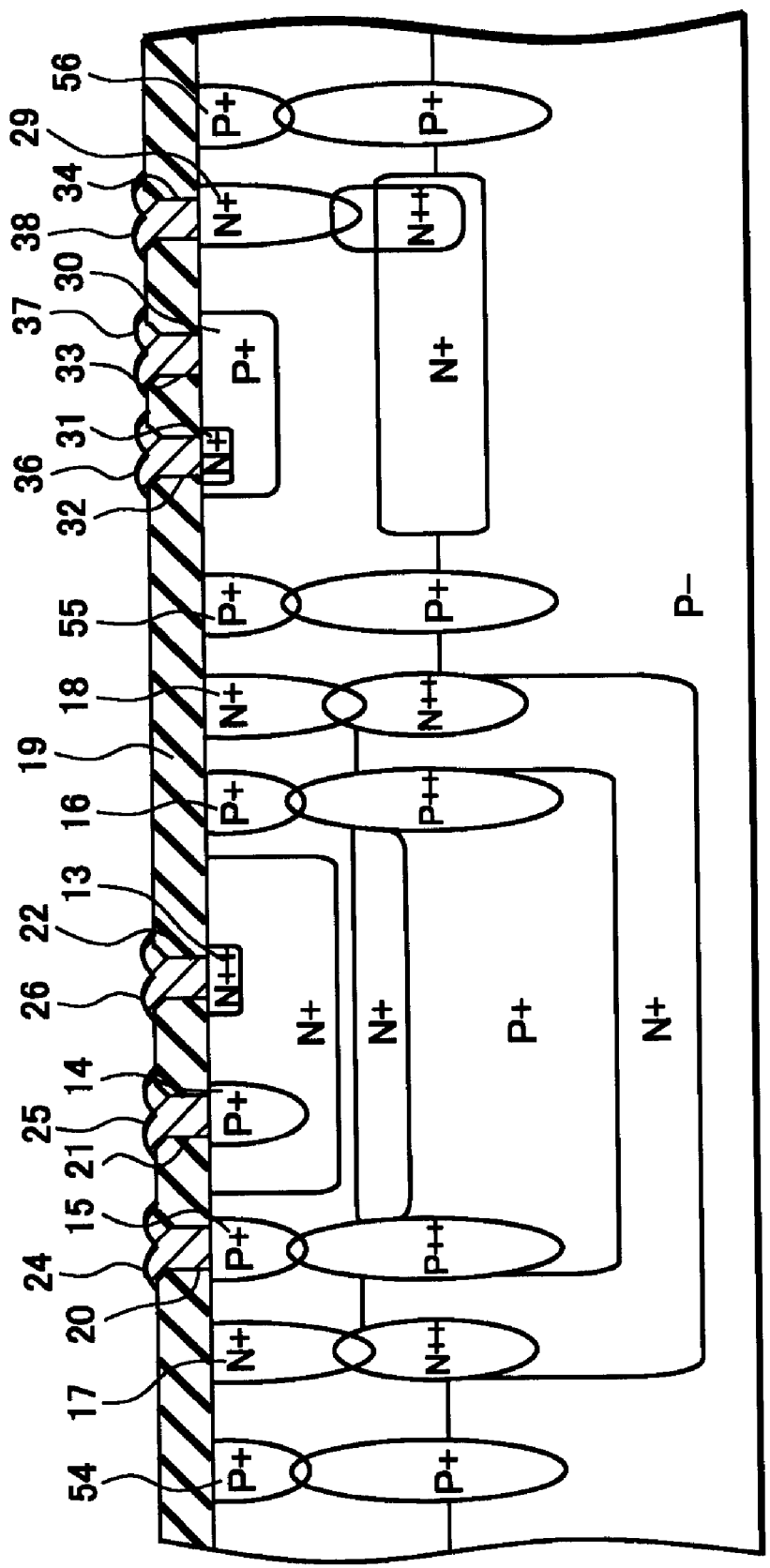
FIG. 10 is a seventh sectional view for describing the method of manufacturing the semiconductor device of the embodiment of the present invention.

Next, as shown in FIG. 10, by using a known photolithographic technique, P type diffusion layers 14, 15, 16, 30, 54, 55 and 56, and N type diffusion layers 13, 17, 18, 29 and 31 are formed with desired forming method and order. Incidentally, the P type diffusion layer 14 may be formed in a process same as or different from that of forming the P type diffusion layers 15, 16, 54, 55 and 56.

Thereafter, as an insulating layer 19, for example, a PSG film is deposited on the epitaxial layer 4. By using a known photolithographic technique, contact holes 20, 21, 22, 32, 33 and 34 are formed in the insulating layer 19 by dry etching using gas containing $CHF_3+O_2$, for example. In the contact holes 20, 21, 22, 32, 33 and 34, an aluminum alloy, for example, an Al—Si film is selectively formed to form collector electrodes 24 and 38, emitter electrodes 25 and 36, and base electrodes 26 and 37.

It should be noted that, in the present embodiment, described is the case where the P type buried diffusion layer 9, which prevents the N type buried diffusion layer 6 from expanding upward, is formed by implanting ions of phosphorus (P). However, the method of forming the P type buried diffusion layer 9 is not limited to this. As an N type impurity, arsenic (As) or the like may be used. It is to be understood that present invention is not intended to be limited to the above-described embodiments, and various changes may be made therein without departing from the spirit of the present invention.

In the embodiment of the present invention, the width of the upward expansion of the buried diffusion layer used as the collector region of the power vertical PNP transistor is partially checked. With this structure, the film thickness of the epitaxial layers can be made small while maintaining the breakdown voltage characteristics.

In addition, in the embodiment of the present invention, in the control vertical NPN transistor, the film thickness of the epitaxial layers is small, and thus the lateral diffusion of an isolation region is checked. With this structure, the device size of the vertical NPN transistor is reduced.

Additionally, in the embodiment of the present invention, the buried diffusion layer used as the collector region of the vertical PNP transistor has a region in which the buried diffusion layer has expanded upward. By increasing an impurity concentration in a region to which the buried diffusion layer has expanded upward and by using the region as the connecting region of the collector region, the collector resistance can be reduced.

Moreover, in the embodiment of the present invention, with an impurity concentration maintained low in a surface of the P type buried diffusion layer used as the collector region of the vertical PNP transistor and in the vicinity of the surface, the N type buried diffusion layer is formed. With this method, the upward expansion of the P type buried diffusion layer can be checked.

Furthermore, in the embodiment of the present invention, with the N type buried diffusion layer formed with overlapping the P type buried diffusion layer used as the collector region of the vertical type PNP transistor, the epitaxial layer is deposited. With this method, a P type impurity concentration in the substrate surface is reduced so that the autodoping can be confined.

What is claimed is:

1. A semiconductor device comprising:
   a semiconductor substrate of one conductivity type;
   an epitaxial layer of opposite conductivity type formed on the semiconductor substrate;
   a first buried diffusion layer of the one conductivity type, which is formed so as to extend in the semiconductor substrate and the epitaxial layer, and which is used as a collector region;
   a first buried diffusion layer of the opposite conductivity type, which is formed so as to extend in the semiconductor substrate and the epitaxial layer, and which isolates the semiconductor substrate from the first buried diffusion layer of the one conductivity type by junction isolation;
   a second buried diffusion layer of the opposite conductivity type, a forming area thereof overlapping the first buried diffusion layer of the one conductivity type, which expands upward at least from an upper surface of the first buried diffusion layer of the one conductivity type;
   a diffusion layer of the opposite conductivity type, which is formed from a surface of the epitaxial layer, and which is used as a base region;
   a first diffusion layer of the one conductivity type, which is formed from the surface of the epitaxial layer, and which is used as the collector region; and
   a second diffusion layer of the one conductivity type, which is formed in the diffusion layer of the opposite conductivity type, and which is used as an emitter region.

2. The semiconductor device according to claim 1, wherein
the second buried diffusion layer of the opposite conductivity type is formed inside the first buried diffusion layer of the one conductivity type.

3. The semiconductor device according to claim 2, wherein
the first buried diffusion layer of the one conductivity type expands upward in a way that the first buried diffusion layer of the one conductivity type surrounds the second buried diffusion layer of the opposite conductivity type.

4. The semiconductor device according to any one of claims 2 and 3, wherein
in a region to which the first buried diffusion layer of the one conductivity type has expanded upward, the second buried diffusion layer of the one conductivity type is formed in an overlapping manner.

5. The semiconductor device according to claim 4, wherein
the first diffusion layer of the one conductivity type is connected to the first buried diffusion layer of the one conductivity type, and the second buried diffusion layer of the one conductivity type is formed in a connecting region.

6. The semiconductor device according to claim 1, wherein
an impurity forming the first buried diffusion layer of the one conductivity type is boron, and an impurity forming the second buried diffusion layer of the opposite conductivity type is phosphorus.

* * * * *